(12) United States Patent
Huang et al.

(10) Patent No.: US 6,410,861 B1
(45) Date of Patent: Jun. 25, 2002

(54) LOW PROFILE INTERCONNECT STRUCTURE

(75) Inventors: Rong-Fong Huang, Tempe; Chia-Yu Fu, Chandler, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/454,342

(22) Filed: Dec. 3, 1999

(51) Int. Cl.⁷ .................................................. H05K 1/16
(52) U.S. Cl. ............................ 174/260; 29/839; 29/840
(58) Field of Search ................................ 174/260, 261; 361/767–779, 807; 29/837, 839, 840

(56) References Cited

U.S. PATENT DOCUMENTS 4,581,680 A * 4/1986 Garner ........................ 361/403
6,075,711 A * 6/2000 Brown et al. ................ 361/761

* cited by examiner

*Primary Examiner*—Jeffrey Gaffin
*Assistant Examiner*—Jeremy Norris
(74) *Attorney, Agent, or Firm*—William E. Koch

(57) ABSTRACT

Low profile interconnect structure includes an electronic circuit module with a plurality of mounting areas and a plurality of electrical contact areas defined by the mounting surface. The plurality of mounting areas are spaced a first distance from a mounting and interconnect surface parallel to and spaced from the mounting surface and the plurality of electrical contact areas are spaced a second distance, less than the first distance, from the mounting and interconnect surface. Large solder balls are used between the mounting areas and the mounting and interconnect surface to form a solid mount and smaller solder members are used for electrical interconnections.

16 Claims, 1 Drawing Sheet

LOW PROFILE INTERCONNECT STRUCTURE

FIELD OF THE INVENTION

This invention relates to structure and method for mounting and interconnecting electronic circuit modules with a low profile.

BACKGROUND OF THE INVENTION

In present day electronics it is often necessary or desirable to fixedly mount electronic circuit modules on support and interconnect surfaces, such as printed circuit boards, etc. However, in many applications the overall thickness of the mounted modules is a critical parameter that must be kept low.

One prominent method and apparatus for achieving this mounting of modules on a printed circuit board is referred to as a ball grid array (BGA). BGAs include an array of solder balls all having the same relatively large diameter. BGAs are known to provide reliable interconnect for devices with large input/output (I/O) numbers. However, the height ranges from 15 to 35 mils, which has the disadvantage of making the overall height of the device too big.

The use of metal pads for I/O soldering can reduce the interconnect thickness to less than 5 mils, which significantly reduces the overall height of the device when mounted on a printed circuit board. The draw back for metal pads is that the reliability of I/Os is not as good. Due to the low solder height, there is not sufficient solder to relieve the stress generated by thermal mismatch between the module and the printed circuit board.

Accordingly it is highly desirable to provide structure and a method for mounting modules on a supporting and interconnect surface and for achieving a low profile final structure.

BRIEF DESCRIPTION OF THE DRAWINGS

Referring to the drawings.

DESCRIPTION OF THE PREFERRED EMBODIMENT

Figure 1:
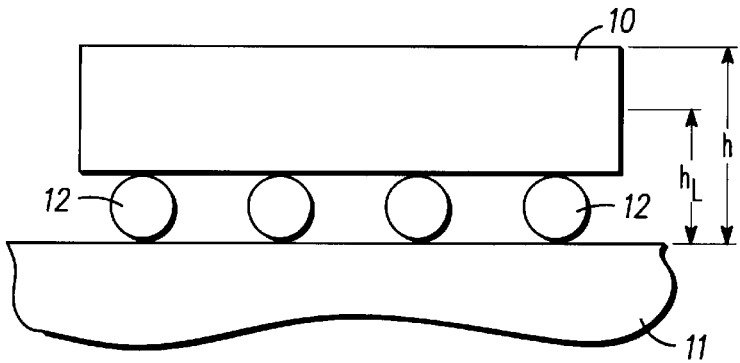
FIG. 1 is a side view of a module mounted on a printed circuit board by a well-known ball grid array.

Turning now to the figures and specifically to FIG. 1, a side view is illustrated of a module 10 mounted on a printed circuit board 11 by means of the well known ball grid array apparatus and method. The ball grid array (BGA) includes a plurality of balls 12 all having substantially the same large diameter. Balls 12 are formed of solder and are used to interconnect contacts on module 10 with contacts on printed circuit board 11. In some instances, additional balls 12 may be used only as physical mounting structure to complete the array.

Generally, the material of module 10 is different than the material forming printed circuit board 11 and the two materials have different coefficients of thermal expansion. In the normal well known use of the ball grid array, the diameter of solder balls 12 is sufficiently large to absorb any stress created by the two different coefficients of thermal expansion. The solder forming balls 12 is sufficiently soft and yielding to absorb the stress without cracking or transferring it to the electrical contacts. However, if balls 12 are formed too small, some of the stress will be transferred to the electrical contacts resulting in cracks and breaks in the solder connection and/or the electrical contact, which in turn causes unreliable electrical contacts.

The problem is that in many applications today the height or profile of the final structure is critical and must be maintained below a level which is generally lower than can be reliably achieved with the ball grid array type of mounting and interconnect.

Figure 2:
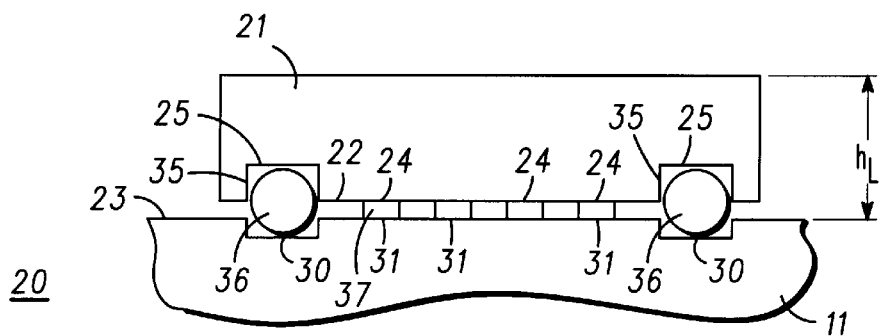
FIG. 2 is a side view of a module mounted on a mounting and interconnect circuit in accordance with the present invention.
Figure 3:
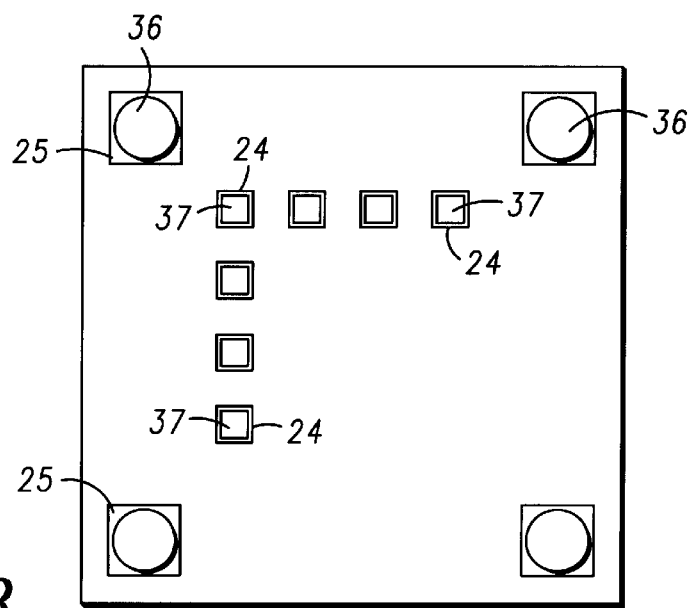
FIG. 3 is a view in bottom plan of the module of FIG. 2.

Turning now to FIGS. 2 and 3, a low profile interconnect structure 20 in accordance with the present invention is illustrated. Structure 20 includes an electronic circuit module 21 which may be any of the well known modules, such as a packaged semiconductor chip, a ceramic hybrid package, etc. Module 21 has a lower mounting surface 22 designed specifically for mounting module 21 on a support and interconnect surface 23. Mounting surface 22 includes a plurality of input/output terminals or electrical contact areas 24 positioned in any convenient location commensurate with the packaging technique and type of electronic circuit involved. Generally, contact areas 24 include metal pads externally accessible and connected internally to the embedded electronic circuit all in accordance with standard multilayer interconnect techniques.

Also included in mounting surface 22 are mounting areas 25 specifically provided and strategically located for physically mounting module 21 on support and interconnect surface 23. Mounting areas 25 may include electrical connections in addition to the physical mounting structure, if desired or convenient. Mounting areas 25 may be included only for physical mounting in some applications. Generally, mounting areas 25 will be spaced apart along surface 22 so as to be positioned at strategic points selected to provide the most support for module 21. For example, in the case where module 21 is generally rectangularly shaped, as in FIG. 3, a mounting area 25 is formed adjacent the edges in each of the four corners.

Support and interconnect surface 23 includes a plurality of mating support areas 30 and a plurality of mating electrical interconnect areas 31. As can be seen best in FIG. 2, with module 21 positioned in a mounting position overlying support and interconnect surface 23, electrical contact areas 24 of module 21 are aligned with mating electrical interconnect areas 31 and mounting areas 25 of module 21 are aligned with the plurality of mating support areas 30. In this position mounting surface 22 of module 21 is generally parallel and spaced from support and interconnect surface 23.

Here it should be noted, that mounting areas 25 of module 21 are spaced from mating support areas 30 a first distance and electrical contact areas 24 of module 21 are spaced from mating electrical interconnect areas 31 a second distance, less than the first distance. This difference in spacing can be provided by using a number of different arrangements. For example, in this preferred embodiment mounting areas 25 are defined by depressions 35 formed in mounting surface 22 of module 21. In addition, depressions 32 are formed in support and interconnect surface 23 to define mating support areas 30. It will of course be understood that when depressions 32 are formed in support and interconnect surface 23 to define mating support areas 30, smaller depressions would be formed in both mounting surface 22 and support and interconnect surface 23 in some specific applications.

To operatively mount module 21 on support and interconnect surface 23 a plurality of mounting structures 36, such as balls, squares, etc., are provided having a first thickness or diameter substantially equal to the first distance and a plurality of electrical connection members 37 having a second thickness smaller than the first thickness. In this preferred embodiment, structures 36 and members 37 are made of different solder material so that structures 36 basically maintain their shape to provide the mounting feature while members 37 flow to provide the electrical connection feature. In a specific example, structures 36 are solder balls with a melting temperature of approximately 310° C. and members 37 are portions of solder paste with a melting temperature of approximately 220° C. A simple reflow process can then be used to electrically connect members 37 while structures 36 provide mechanical mounting, It will be understood that the same materials specifically suited to the various functions can be utilized if desired.

Mounting structures 36 are physically connected one each to each mounting area 25 and to the mating support area 30 so as to physically mount module 21 on support and interconnect surface 23. Simultaneously, electrical connection members 37 are positioned to electrically connect one each of electrical contact areas 24 to mating electrical interconnect areas 31. The process of positioning and fixing in position of structures 36 and members 37 is performed in accordance with standard and well known techniques which need not be elaborated upon here.

By using either dummy or active mounting structures 36 strategically located on module 21, structures 36 will absorb most of the stress developed between module 21 and support and interconnect surface 23 by differences in the coefficients of thermal expansion, or the like, and will protect electrical connection formed or soldered with much thinner electrical connection members 37. Further, by using this approach the height $h_L$ of the final package is substantially less than the height h of a BGA mounted module (see FIG. 1). As illustrated in FIG. 1, to reduce the BGA mounted module to a height of $h_L$ a substantial portion of the module would be lost. In the preferred embodiment, while a small amount of module 21 is lost because of depressions 35, the major portion remains for circuitry. If depressions are formed in the support and interconnect surface no additional volume is lost but some standardization may be lost.

Thus, a low profile interconnect structure is disclosed with reliable mounting. The structure can easily be adapted to come within the height limitations of many applications while still providing reliable contacts and without sacrificing much or any of the electrical circuit volume.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. Low profile interconnect structure comprising:
an electronic circuit module having a mounting surface with a plurality of spaced apart mounting areas and a plurality of electrical contact areas defined by the mounting surface;
a mounting and interconnect plane positioned parallel to and spaced from the mounting surface and having a plurality of mating areas formed in a mounting and interconnect plane, wherein each of the plurality of mating areas is defined by a depression formed in the mounting and interconnect plane;
the plurality of mounting areas of the electronic circuit module being spaced a first distance from the mounting and interconnect plane; and
the plurality of electrical contact areas being spaced a second distance, less than the first distance, from the mounting and interconnect plane.

2. Low profile interconnect structure as claimed in claim 1 wherein the plurality of electrical contact areas is much larger than the plurality of spaced apart mounting areas.

3. Low profile interconnect structure as claimed in claim 1 wherein each mounting area of the plurality of spaced apart mounting areas is defined by a depression formed in the mounting surface.

4. Low profile interconnect structure as claimed in claim 1 wherein the plurality of spaced apart mounting areas are posit ion ed adjacent edges of the module.

5. Low profile interconnect structure as claimed in claim 4 wherein the module is generally rectangularly shaped with four corners and the plurality of spaced apart mounting areas are positioned one each in each of the four corners of the module.

6. Low profile interconnect structure comprising:
an electronic circuit module having a mounting surface with a plurality of spaced apart mounting areas and a plurality of electrical contact areas defined by the mounting surface;
a support and interconnect surface positioned adjacent the mounting surface of the module, the support and interconnect surface having a plurality of mating support areas, wherein each mating support area of the plurality of mating support areas is defined by a depression formed in the support and interconnect surface, the plurality of mating support areas aligned with the mounting areas of the module and a plurality of mating electrical interconnect areas aligned with the plurality of electrical contact areas of the module, the mounting surface and the support and interconnect surface being positioned generally parallel and spaced apart with the mounting areas and the mating support areas being spaced apart a first distance and the electrical contact areas and the mating electrical interconnect areas being spaced apart a second distance less than the first distance;
a plurality of mounting structures having a first thickness, one each of the plurality of mounting structures being physically connected to one each mounting area of the plurality of mounting areas and to the mating support area so as to physically mount the module on the support and interconnect surface; and
a plurality of electrical connection members having a second thickness smaller than the first thickness, one each of the plurality of electrical connection members being electrically connected to one each electrical contact area of the plurality of electrical contact areas and the mating electrical interconnect area.

7. Low profile interconnect structure as claimed in claim 6 wherein the plurality of electrical contact areas is much larger than the plurality of spaced apart mounting areas.

8. Low profile interconnect structure as claimed in claim 6 wherein each mounting area of the plurality of spaced apart mounting areas is defined by a depression formed in the mounting surface.

9. Low profile interconnect structure as claimed in claim 6 wherein the mounting structures include solder.

10. Low profile interconnect structure as claimed in claim 6 wherein the electrical connection members include solder.

11. Low profile interconnect structure as claimed in claim 6 wherein the plurality of spaced apart mounting areas are positioned adjacent edges of the module.

12. Low profile interconnect structure as claimed in claim 11 wherein the module is generally rectangularly shaped with four corners and the plurality of spaced apart mounting areas are positioned one each in each of the four corners of the module.

13. A method of low profile interconnecting an electronic circuit module with a support and interconnect surface comprising the steps of;

provided an electronic circuit module having a mounting surface with a plurality of spaced apart mounting areas and a plurality of electrical contact areas defined by the mounting surface, the plurality of mounting areas being spaced a first distance from a mounting and interconnect plane parallel to and spaced from the mounting surface, and the plurality of electrical contact areas being spaced a second distance, less than the first distance, from the mounting and interconnect plane;

providing a support and interconnect surface having a plurality of mating support areas and a plurality of mating electrical interconnect areas, wherein each mating support area of the plurality of mating support areas is defined by a depression formed in the support and interconnect surface;

providing a plurality of mounting structures having a first thickness;

providing a plurality of electrical connection members having a second thickness smaller than the first thickness; and physically connecting one each of the plurality of mounting structures to one each mounting area of the plurality of mounting areas and to the mating support area so as to physically mount the module on the support and interconnect surface and electrically connecting one each of the plurality of electrical connection members to one each electrical contact area of the plurality of electrical contact areas and the mating electrical interconnect area so as to position the mounting surface and the support and interconnect surface in a spaced apart orientation with the mounting areas and the mating support areas being spaced apart a first distance and the electrical contact areas and the mating electrical interconnect areas being spaced apart a second distance less than the first distance.

14. A method of low profile interconnecting an electronic circuit module with a support and interconnect surface as claimed in claim 13 wherein the step of providing the electronic circuit module includes providing a module with the plurality of mounting areas defined by depressions formed in the mounting surface.

15. A method of low profile interconnecting an electronic circuit module with a support and interconnect surface as claimed in claim 13 wherein the steps of providing the plurality of mounting structures and providing the plurality of electrical connection members includes providing solder balls.

16. A method of low profile interconnecting an electronic circuit module with a support and interconnect surface as claimed in claim 15 wherein the steps of physically connecting includes partially melting the solder balls to provide the physical and electrical connections.

* * * * *